United States Patent
Trotta (10) Patent No.: US 9,568,541 B2
(45) Date of Patent: Feb. 14, 2017

(54) TESTING OF SEMICONDUCTOR PACKAGES WITH INTEGRATED ANTENNAS

(71) Applicant: Infineon Technologies AG, Neubiberg (DE)

(72) Inventor: Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 282 days.

(21) Appl. No.: 14/525,940

(22) Filed: Oct. 28, 2014

(65) Prior Publication Data

US 2016/0116523 A1 Apr. 28, 2016

(51) Int. Cl.
*G01R 29/10* (2006.01)
*G01R 31/28* (2006.01)
*G01R 31/26* (2014.01)

(52) U.S. Cl.
CPC ....... *G01R 31/2822* (2013.01); *G01R 31/2607* (2013.01); *G01R 31/2644* (2013.01)

(58) Field of Classification Search
CPC ............ G01R 31/2822; G01R 31/2644; G01R 31/2607
USPC ......................................................... 343/703
See application file for complete search history.

(56) References Cited

U.S. PATENT DOCUMENTS

| | | | |
|---|---|---|---|
| 7,692,588 B2 | 4/2010 | Beer et al. | |
| 8,791,862 B1 * | 7/2014 | Beard | H01Q 1/242 257/734 |
| 8,866,292 B2 * | 10/2014 | Beer | H01L 23/49822 257/698 |

* cited by examiner

*Primary Examiner* — Khai M Nguyen
(74) *Attorney, Agent, or Firm* — Murphy, Bilak & Homiller, PLLC (57) ABSTRACT

A semiconductor package includes a semiconductor die, an antenna embedded in insulating material contacting a first main side of the semiconductor die and electrically connected to a first pad of the semiconductor die and a coupling structure embedded in the insulating material, electrically connected to a second pad of the semiconductor die and spaced from the antenna. The coupling structure is configured to sense energy radiated from the antenna or a feedline connected to the antenna. The semiconductor die includes a transmitter circuit operable to drive a signal onto the antenna through the feedline. The semiconductor die also includes a transmit path verification circuit operable to indicate if the antenna is electrically connected to the first pad of the semiconductor die based on a signal from the coupling structure that corresponds to the energy sensed by the coupling structure.

21 Claims, 11 Drawing Sheets

TESTING OF SEMICONDUCTOR PACKAGES WITH INTEGRATED ANTENNAS

TECHNICAL FIELD

The present application relates to semiconductor packages with antennas, in particular verifying the internal antenna connections.

BACKGROUND

Millimeter wave communication and radar systems are often based on expensive PCBs (printed circuit boards) which have suitable dielectric properties. The antenna elements are designed on those PCBs. The overall system, including the antenna, is typically tested by the end customer. Some low-cost, short-range communication and ranging systems integrate the antenna either on chip or embedded in the semiconductor package. In this case, no expensive RF PCBs are needed. However, semiconductor packages with integrated antennas face new challenges in that the internal antenna connections must be verified and also whether there is an electromagnetic field present.

SUMMARY

According to an embodiment of a semiconductor package, the semiconductor package comprises a semiconductor die, an antenna embedded in insulating material contacting a first main side of the semiconductor die and electrically connected to a first pad of the semiconductor die and a coupling structure embedded in the insulating material, electrically connected to a second pad of the semiconductor die and spaced from the antenna. The coupling structure is configured to sense energy radiated from the antenna or a feedline connected to the antenna. The semiconductor die includes a transmitter circuit operable to drive a signal onto the antenna through the feedline. The semiconductor die includes a transmit path verification circuit operable to indicate if the antenna is electrically connected to the first pad of the semiconductor die based on a signal from the coupling structure that corresponds to the energy sensed by the coupling structure.

According to an embodiment of verifying the internal antenna connection within the semiconductor package described above, the method comprises: driving a signal onto the antenna through the feedline; sensing, by the coupling structure, energy radiated from the antenna or a feedline connected to the antenna as a result of transmitting the signal; and indicating if the antenna is electrically connected to the first pad of the semiconductor die based on a signal from the coupling structure that corresponds to the energy sensed by the coupling structure.

According to another embodiment of a semiconductor package, the semiconductor package comprises a semiconductor die, an antenna embedded in insulating material contacting a first main side of the semiconductor die and electrically connected to a first pad of the semiconductor die and a coupling structure embedded in the insulating material, electrically connected to a second pad of the semiconductor die and spaced from the antenna, the coupling structure being configured to sense energy radiated from the antenna or a feedline connected to the antenna. The semiconductor die includes a receiver circuit operable to receive a signal from the feedline connected to the antenna. The semiconductor die includes a receive path verification circuit operable to drive a test signal onto the coupling structure so that energy from the test signal couples to the antenna or the feedline connected to the antenna and the receiver circuit detects a coupling signal that corresponds to the energy of the test signal coupled to the antenna or the feedline connected to the antenna. The coupling signal detected by the receiver circuit indicates if the antenna is electrically connected to the first pad of the semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes

DETAILED DESCRIPTION

Embodiments described herein provide for verifying the internal connections to built-in antenna elements integrated into semiconductor packages. The embodiments described herein include verification circuitry for the transmit and/or receive-side. On the transmit-side, a coupling structure is spaced in close proximity to the transmit antenna or feedline connected to the transmit antenna so that some electromagnetic energy radiated by the transmit antenna/feedline is sensed by the coupling structure. This coupled energy, represented by a signal propagating along the coupling structure, is processed by a transmit path verification circuit included in the semiconductor die. The transmit path verification circuit indicates if the antenna is electrically connected to the corresponding pad of the semiconductor die based on the signal from the coupling structure which corresponds to the energy sensed by the coupling structure. On the receive-side, a coupling structure is in close proximity to the receive antenna or feedline connected to the receive antenna so that some energy from a test signal driven onto the coupling structure is coupled into the receive antenna/feedline. The energy level of the test signal is high enough so that the energy coupled into the receive antenna/feedline is observable, in the form of a coupling signal, by the receiver circuit included in the semiconductor die. During normal operation, the receiver circuit processes electromagnetic transmission signals picked up by the receive antenna. During the antenna verification process, the coupling signal detected by the receiver circuit indicates if the receive antenna is electrically connected to the corresponding pad of the semiconductor die.

Figure 1:
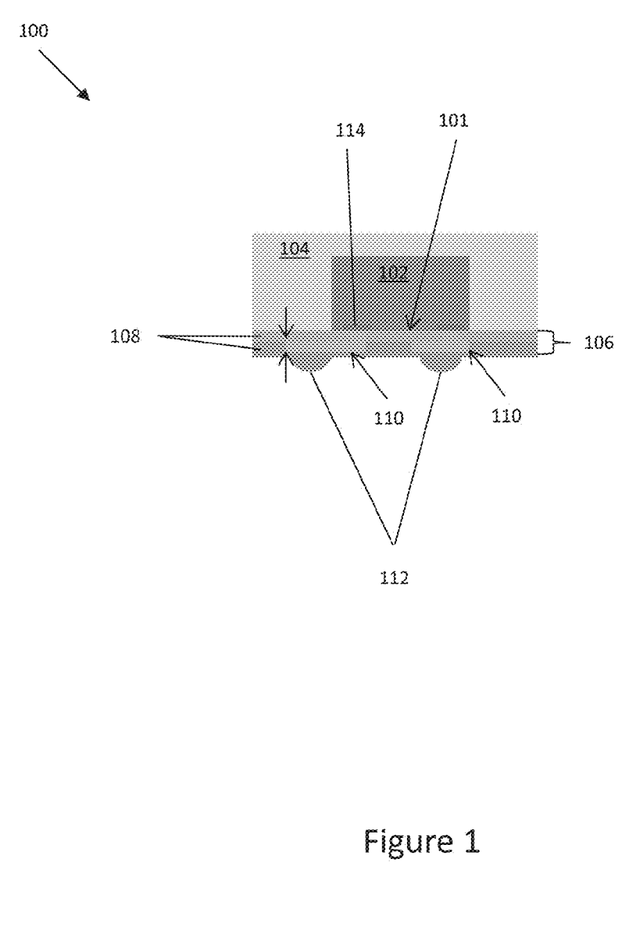
FIG. 1 illustrates a sectional view of an embodiment of a semiconductor package that includes an integrated antenna and a coupling structure and corresponding circuitry for verifying the internal antenna connections.

FIG. 1 illustrates a sectional view of an embodiment of a semiconductor package 100 that includes integrated antenna elements. According to this embodiment, the semiconductor package 100 is molded packaged in that one or more semiconductor dies 102 included in the package 100 are embedded in a molding compound 104 such as a silicone molding compound, epoxy molding compound, etc. The bottom side 101 of each semiconductor die 102 is uncovered by the molding compound 104, and an insulating material 106 which can include one or more insulating layers 108 is on the same side of the molding compound 104 as the side 101 of the semiconductor die 102 which is uncovered by the molding compound 104. In other embodiments, the semiconductor package 100 is not molded and each semiconductor die 102 included in the package 100 is not embedded in a molding compound.

One or more metal redistribution layers 110 are disposed in the insulating material 106 that contacts the bottom side 101 of the semiconductor die 102 and external contacts 112 such as solder bumps, columns, etc. contact the last redistribution layer 110 to provide points of external electrical contact for the package 100. In one embodiment, eWLB (embedded wafer level ball grid array) packaging technology is used to fabricate the semiconductor package 100. With eWLB and similar packaging technologies, the package interconnects are applied on an artificial wafer made of silicon dies and a casting compound. Electrical connections from the die pads 114 to the interconnects are realized in thin-film technology. This includes one or more metal redistribution layers 112 disposed in the insulating material 106. Each metal redistribution layer 112 is electrically connected to one or more pads 114 of the semiconductor die 102 through openings in the insulating material 106.

The semiconductor package 100 further includes an antenna embedded in the insulating material 106 of the package 100 as opposed to being formed outside the package 100 e.g. on a board. The antenna is electrically connected to one or more pads 114 of the semiconductor die 102. A coupling structure also is embedded in the insulating material 106 of the semiconductor package 100. The coupling structure is provided for verifying the internal connections to the antenna. The coupling structure is electrically connected to one or more different pads 114 of the semiconductor die 102 and spaced from the antenna. The coupling structure is configured to sense energy radiated from the antenna or a feedline connected to the antenna. The semiconductor die 102 includes a verification circuit for indicating if the antenna is electrically connected to the corresponding pad(s) 114 of the semiconductor die 102 based on a signal from the coupling structure that corresponds to the energy sensed by the coupling structure.

In one embodiment, eWLB or similar packaging technology is used to fabricate the semiconductor package 100 and the antenna is formed in one of the metal redistribution layers 112 disposed in the insulating material 106 of the package 100. The coupling structure can be formed in the same metal layer 112 as the antenna (e.g. in the case of a single metal redistribution layer package), or in a different metal layer 112 of the semiconductor package 100 (e.g. in the case of a multi-metal redistribution layer package). FIG. 1 shows a general exemplary construction of the semiconductor package 100, with many details relating to the antenna and coupling structure out of view. The semiconductor package 100 can have any standard construction in which the antenna is integrated into the package e.g. embedded in the insulating material 106 of the package 100 or formed within the internal metallization of the semiconductor die 102. Various antenna and coupling structure embodiments are shown in greater detail in FIGS. 2-5.

Figure 2:
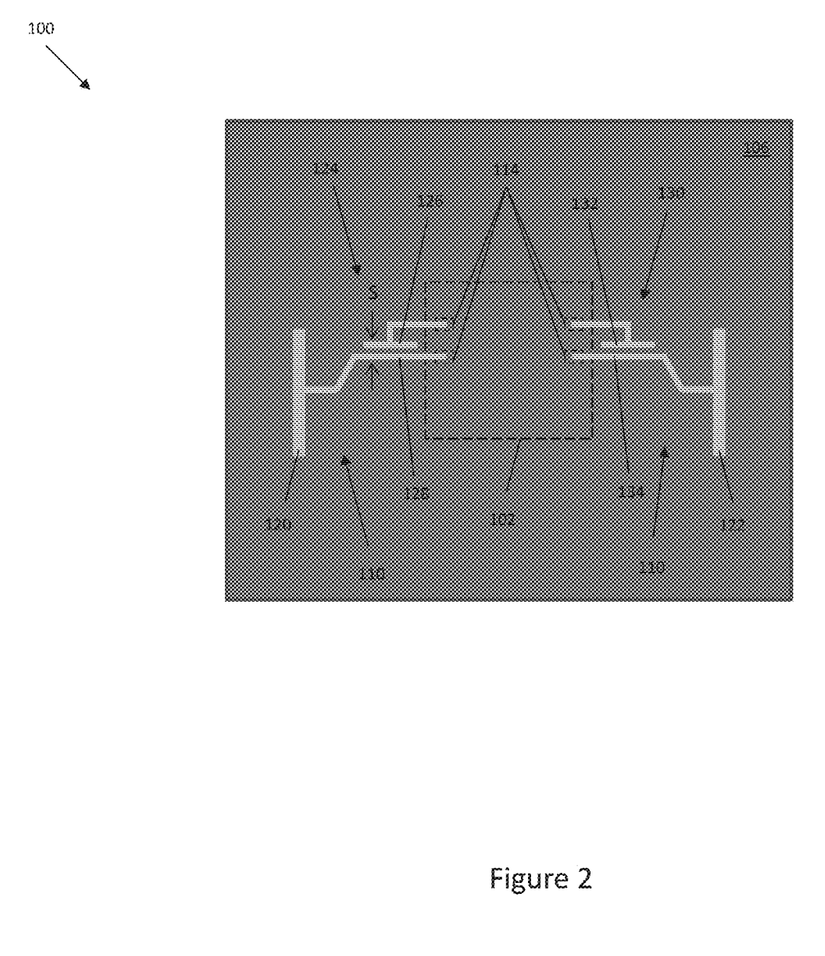
FIG. 2 illustrates a plan view of an embodiment of a semiconductor package that includes an integrated antenna and a coupling structure and corresponding circuitry for verifying the internal antenna connections.

FIG. 2 illustrates a bottom plan view of the semiconductor package 100, according to an embodiment. The semiconductor die 102 and pads 114 are illustrated with dashed boxes in FIG. 2 since they are covered by the insulating material 106 and therefore out of view. According to this embodiment, the package 100 includes a transmit antenna 120 and a receive antenna 130. Both antennas 120, 122 are monopole antennas in this example. The transmit-side coupling structure 124 comprises a single coupling element 126 such as a directional coupler implemented as a metal line spaced in close proximity and parallel to the transmit antenna 120 or feedline 128 connected to the transmit antenna 120. The term 'in close proximity' as used herein means that the coupling structure 124 does not contact but is close enough to the corresponding antenna 120 or feedline 128 to sense energy radiated from the antenna/feedline 120/128. The spacing (S) between the coupling structure 124 and the antenna/feedline 120/128 depends on several variables including thickness of the metal layer 110 in which the coupling structure 124 is formed, dielectric constant of the insulating material 106, line loss of the metal layer 110, etc. In one embodiment, the spacing is such that the coupling structure 124 has between −30 dB and −40 dB of coupling between the antenna/feedline 120/128. At these coupling energies, the coupling structure 124 can still sense enough energy radiated by the antenna/feedline 120/128 during testing in order to verify the internal antenna connections elements while not noticeably affecting antenna function during normal transmit (receive) operation. In FIG. 2, the coupling structure 124 is in close proximity to the transmit antenna feedline 128 and therefore senses energy radiated from the feedline 128.

Further according to the embodiment shown in FIG. 2, the transmit antenna 120 and corresponding coupling structure 124 are both formed in the same metal layer 110 disposed in the insulating material 106 of the package 100. This metal layer 110 is electrically connected to pads 114 of the semiconductor die 102 through openings in the insulating material 106. The coupling structure 124 is spaced in close lateral (horizontal) proximity to the transmit antenna feedline 128.

The semiconductor package 100 can further include a receive antenna 122 in the case of a package that both transmits and receives. The receive antenna 122 is embedded in the insulating material 106 of the package 100 and electrically connected to a third pad 114 of the semiconductor die 102. Further according to this embodiment, an additional coupling structure 130 is provided for verifying the internal connections to the receive antenna 122. The receive-side coupling structure 130 is embedded in the package insulating material 106, electrically connected to a fourth pad 114 of the semiconductor die 102 and spaced from the receive antenna 122. The receive-side coupling structure 130 comprises a coupling element 132 configured to sense energy radiated from the receive antenna 122 or feedline 134 connected to the receive antenna 122. In FIG. 2, the coupling element 132 of the receive coupling structure 130 is in close proximity and parallel to the receive antenna feedline 134 and therefore senses energy radiated from this feedline 134.

The semiconductor die 102 includes a receiver circuit for receiving signals from the receive antenna 122 during normal operation. The semiconductor die 102 also includes a receive path verification circuit for driving a test signal onto the receive-side coupling structure 130 so that energy from the test signal couples to the receive antenna 122 or receive antenna feedline 134. The receiver circuit detects a coupling signal that corresponds to the energy of the test signal coupled to the receive antenna/feedline 122/134. The coupling signal detected by the receiver circuit indicates if the receive antenna 122 is electrically connected to the corresponding pad 114 of the semiconductor die 102. Only the antennas 120, 122 and coupling structures 124, 130 are shown formed in a metal layer 110 of the package 100 in FIG. 2. In reality, additional fan-out connections to the semiconductor die 102 are provided in this metal layer 110 but are not shown in FIG. 2 for ease of illustration.

Figure 3A:
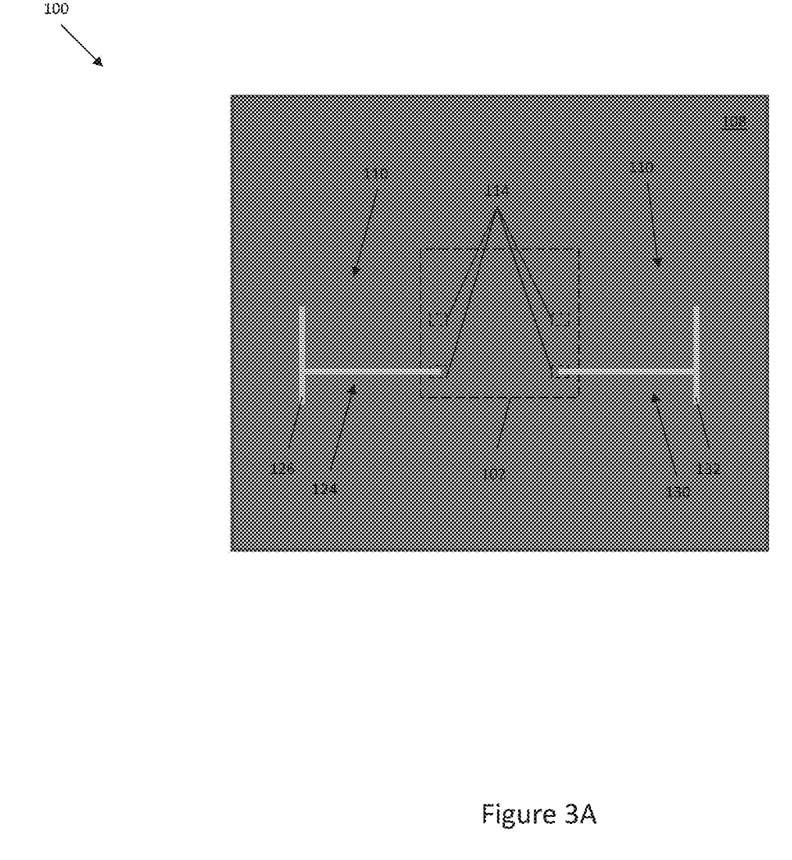
FIGS. 3A and 3B, illustrates a plan view of another embodiment of a semiconductor package that includes an integrated antenna and a coupling structure and corresponding circuitry for verifying the internal antenna connections.
Figure 3B:
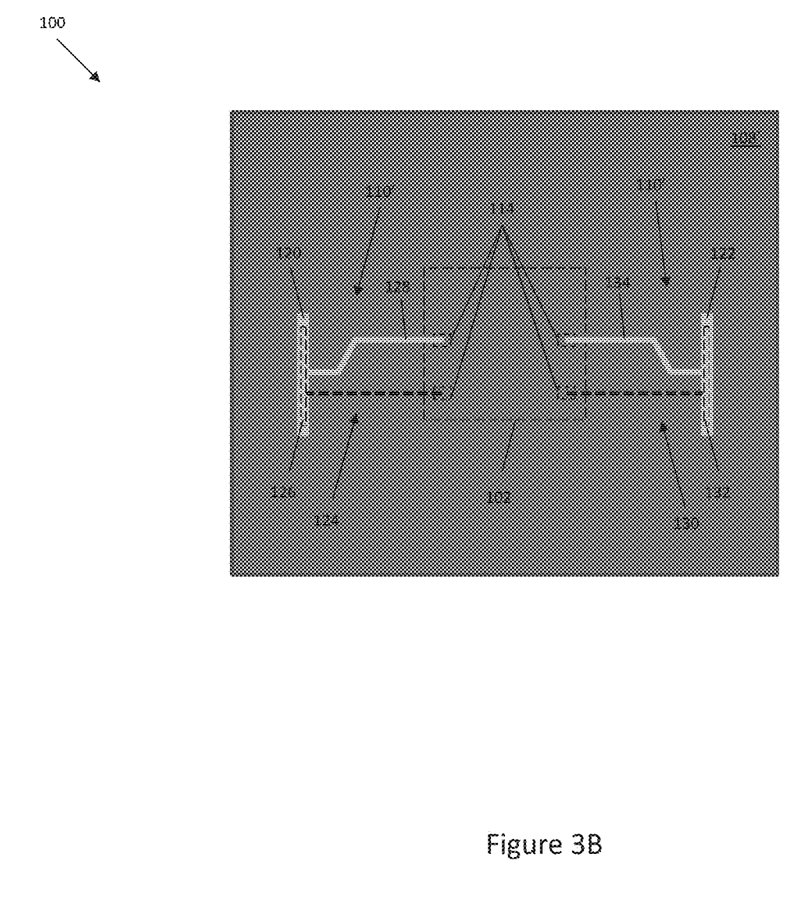

FIG. 3, which includes FIGS. 3A and 3B, illustrates a bottom plan view of the semiconductor package 100, according to another embodiment. The embodiment shown in FIG. 3 is similar to the embodiment shown in FIG. 2, however, the antennas 120, 122 and corresponding coupling structures 124, 130 are formed in different metal layers 110 disposed in the insulating material 106 of the package 100. The coupling element 126/132 of each coupling structure 124/130 is spaced in close vertical proximity and parallel to the corresponding antenna 120/122 or antenna feedline 128/134. FIG. 3A shows the package 100 after a first insulating layer 108 is formed on the backside of the semiconductor die 102 and a first metal layer 110 is disposed in the first insulating layer 108. The coupling structures 124, 130 can be formed in the first metal layer 110, each of which is connected to one or more pads 114 of the semiconductor die 102 through openings in the first insulating layer 108. FIG. 3B shows the package 100 after a second insulating layer 108' is formed on the first metal layer 110 and a second metal layer 110' is disposed in the second insulating layer 108'. The antennas 120, 122 and corresponding feedlines 128, 134 are formed in the second metal layer 110', which is directly connected to one or more pads 114 of the semiconductor die 102 through openings in the second insulating layer 108' or indirectly via the first metal layer 110. The underlying coupling structure is shown with dashed lines in FIG. 3B since it is covered by the second insulation layer and therefore out of view. The antenna and coupling structures can be formed in any metal layer(s) of the package.

Figure 4:
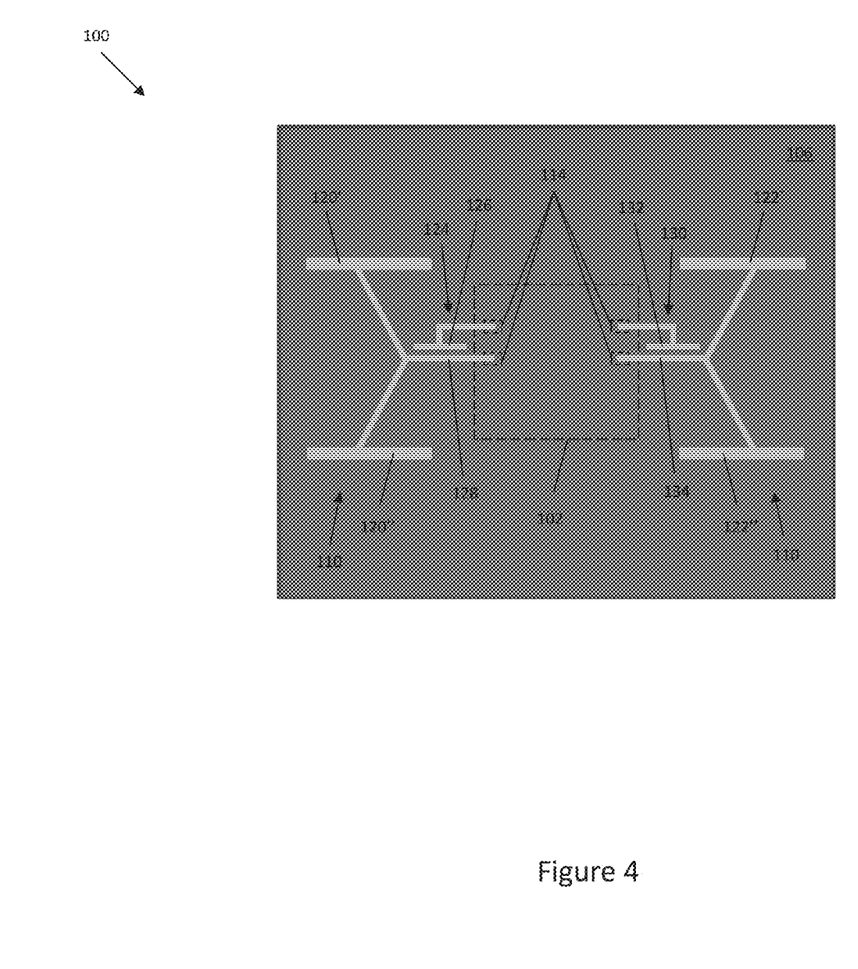
FIG. 4 illustrates a plan view of yet another embodiment of a semiconductor package that includes an integrated antenna and a coupling structure and corresponding circuitry for verifying the internal antenna connections.

FIG. 4 illustrates a bottom plan view of the semiconductor package 100, according to yet another embodiment. The embodiment shown in FIG. 4 is similar to the embodiment shown in FIG. 2, however, the transmit and receive antennas 120, 122 are implemented as dipole antennas instead of monopole antennas. Each dipole antenna 120, 122 comprises two conductive elements 120', 120", 122', 122" such as metal lines, which can be bilaterally symmetrical. The driving current from the transmitter is applied, or for receiving antennas the output signal to the receiver is taken, between the two halves of the respective antennas 120, 122. Each coupling structure 124, 130 is in close proximity to one or both conductors 120', 120", 122', 122" of the corresponding dipole antenna 120, 122, or to the respective feedline 128, 134 for that dipole antenna 120, 122.

Figure 5:
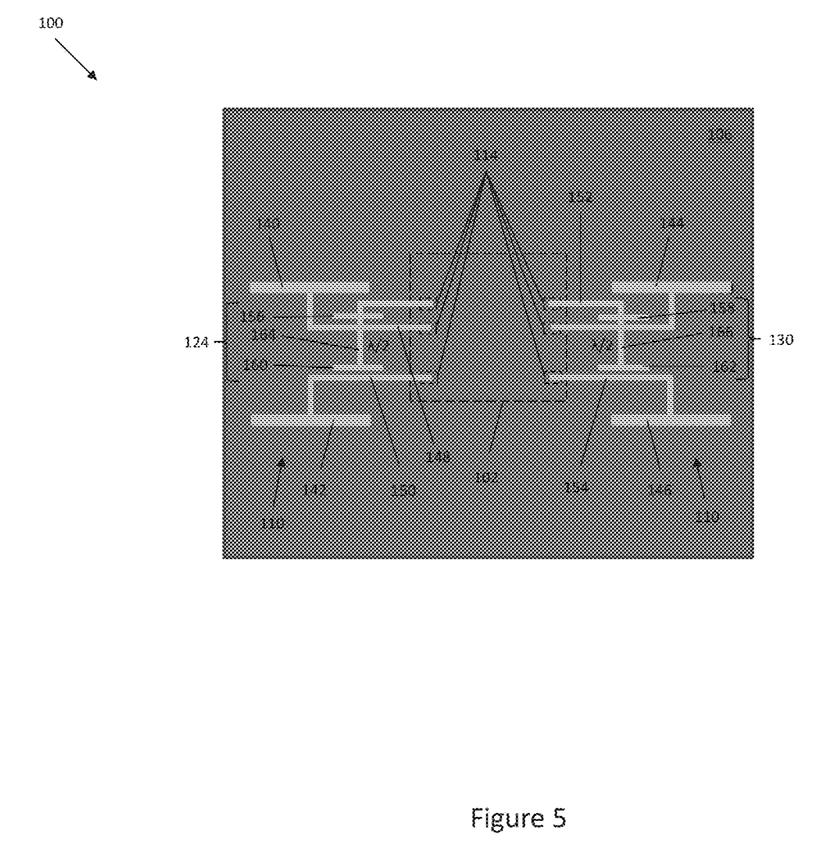
FIG. 5 illustrates a plan view of still another embodiment of a semiconductor package that includes an integrated antenna and a coupling structure and corresponding circuitry for verifying the internal antenna connections.

FIG. 5 illustrates a bottom plan view of the semiconductor package 100, according to still another embodiment. The embodiment shown in FIG. 5 is similar to the embodiment shown in FIG. 2, however, the transmit and receive antennas 120, 122 are implemented in a differential manner. In this case, the transmit and receive-side each have two antennas 140, 142, 144, 146 directly or indirectly connected to different pads 114 of the semiconductor die 102 by separate feedlines 148, 150, 152, 154. Each corresponding coupling structure 124/130 comprises a first coupling element 156/158 such as a first directional coupler spaced in close proximity and parallel to one antenna 140/144 or the corresponding feedline 148/152, a second coupling element 160/162 such as a second directional coupler spaced in close proximity and parallel to the other antenna 142/146 or the corresponding feedline 150/154, and a $\lambda/2$ coupling element 164/166 directly or indirectly connecting the first and second coupling elements 156/160, 158/162 to a pad 114 of the semiconductor die 102 where $\lambda$ is wavelength. Each $\lambda/2$ coupling element 164, 166 generates a shift of 180 degrees between the differential lines 156/160, 158/162 so that the resulting signal adds in phase, allowing for single-ended termination at the semiconductor die 102 and simplifying the design of the respective transmit and receive path verification circuits included in the die 102. Otherwise, a separate transmit (receive) path verification circuit is needed for each transmit (receive) antenna in this differential case.

On the receive-side, the receiver circuit included in the semiconductor die 102 receives a differential signal from the two receive antennas 144, 146 during normal operation. In test mode, the receive path verification circuit drives a single-ended test signal onto the $\lambda/2$ coupling element 166 for verifying the receive antenna connections. On the transmit-side, the transmitter circuit included in the semiconductor die 102 drives a differential signal onto the two transmit antennas 140, 142 during normal operation. In test mode, the transmit path verification circuit indicates if the transmit antennas 140, 142 are electrically connected to the respective pads 114 of the semiconductor die 102 based on a signal from the $\lambda/2$ coupling element 164 that corresponds to the energy sensed by the first and second coupling elements 156, 160 of the transmit-side coupling structure 124.

Figure 6:
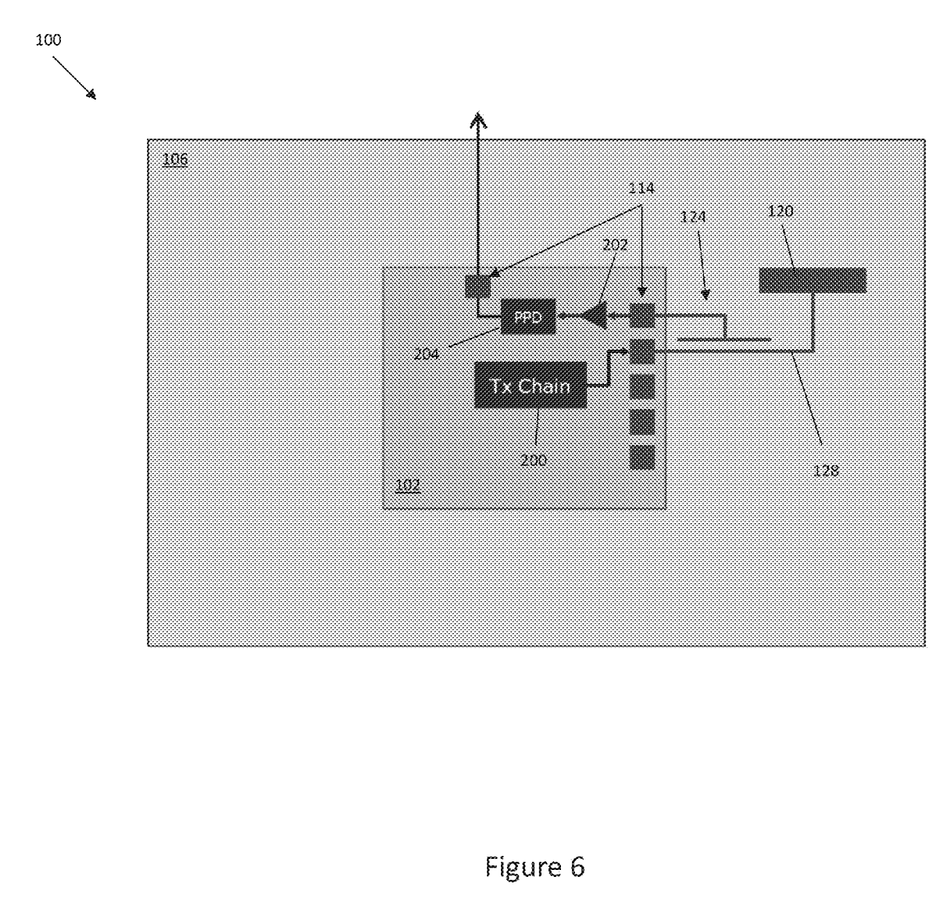
FIG. 6 illustrates a block diagram of an embodiment of a semiconductor package that includes an integrated transmit antenna and a coupling structure and corresponding circuitry for verifying the internal transmit antenna connections.

FIG. 6 illustrates a block diagram of an embodiment of a semiconductor package 100 that includes integrated antenna elements. The semiconductor package 100 includes a semiconductor die 102, an antenna 120 embedded in insulating material 106 of the package 100 and electrically connected to a first pad 114 of the semiconductor die 102, and a coupling structure 124 embedded in the insulating material 106. The coupling structure 124 is electrically connected to a second pad 114 of the semiconductor die 102 and spaced from the antenna 120. The coupling structure 124 is configured to sense energy radiated from the feedline 128 connected to the antenna 120 as previously described herein in connection with FIGS. 1-5.

The semiconductor die 102 includes a transmitter circuit (Tx Chain) 200 for driving a signal onto the antenna 120 through the feedline 128 during normal operation. The semiconductor die 102 also includes a transmit path verification circuit for indicating if the antenna 120 is electrically connected to the first pad 114 of the semiconductor die 102 based on a signal from the coupling structure 124 that corresponds to the energy sensed by the coupling structure 124. According to this embodiment, the transmit path verification circuit comprises an amplifier 202 such as a low-noise amplifier (LNA) electrically connected to the second pad 114 of the semiconductor die 102 for amplifying the signal from the coupling structure 124. The transmit path verification circuit also comprises a peak detector 204. The amplified signal from the coupling structure 124 is input to the peak detector 204. The output voltage of the peak detector 204 corresponds to the peak value of the amplified signal from the coupling structure 124. The output of the peak detector 204 can be electrically connected to an output pad 114 of the semiconductor die 102 and driven off the package 100 for external analysis, the peak value indicating whether the antenna 120 is connected internally to the semiconductor die 102 and whether an electromagnetic field is present.

Figure 7:
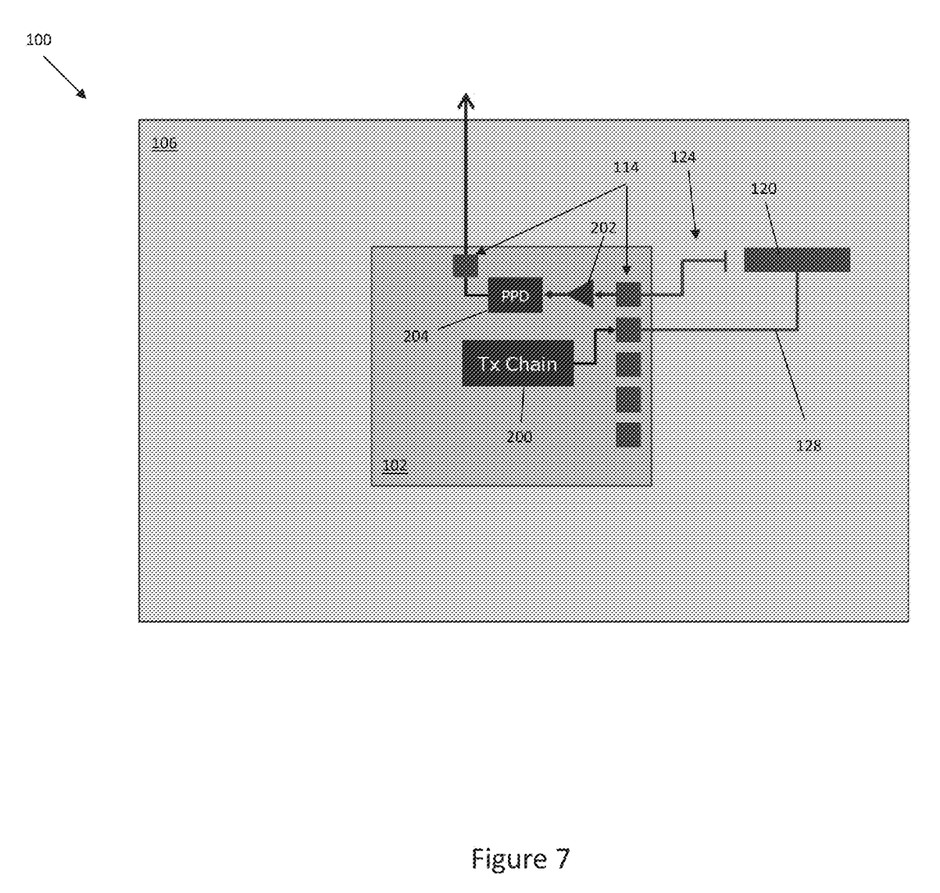
FIG. 7 illustrates a block diagram of another embodiment of a semiconductor package that includes an integrated transmit antenna and a coupling structure and corresponding circuitry for verifying the internal transmit antenna connections.

FIG. 7 illustrates a block diagram of another embodiment of a semiconductor package 100 that includes integrated antenna elements. The embodiment shown in FIG. 7 is similar to the embodiment shown in FIG. 6, however, the coupling structure 124 is spaced in close proximity to the antenna 120 instead of the antenna feedline 128. According to this embodiment, the coupling structure 124 is in the electromagnetic radiation path of the antenna 120. With this configuration, the coupling structure 124 modifies the behavior of the antenna 120 and should have as little coupling to the antenna 120 as possible, but so that the coupling structure 124 can still sense enough energy radiated from the antenna 120 for the transmit path verification circuit to indicate whether the antenna 120 is connected properly.

Figure 8:
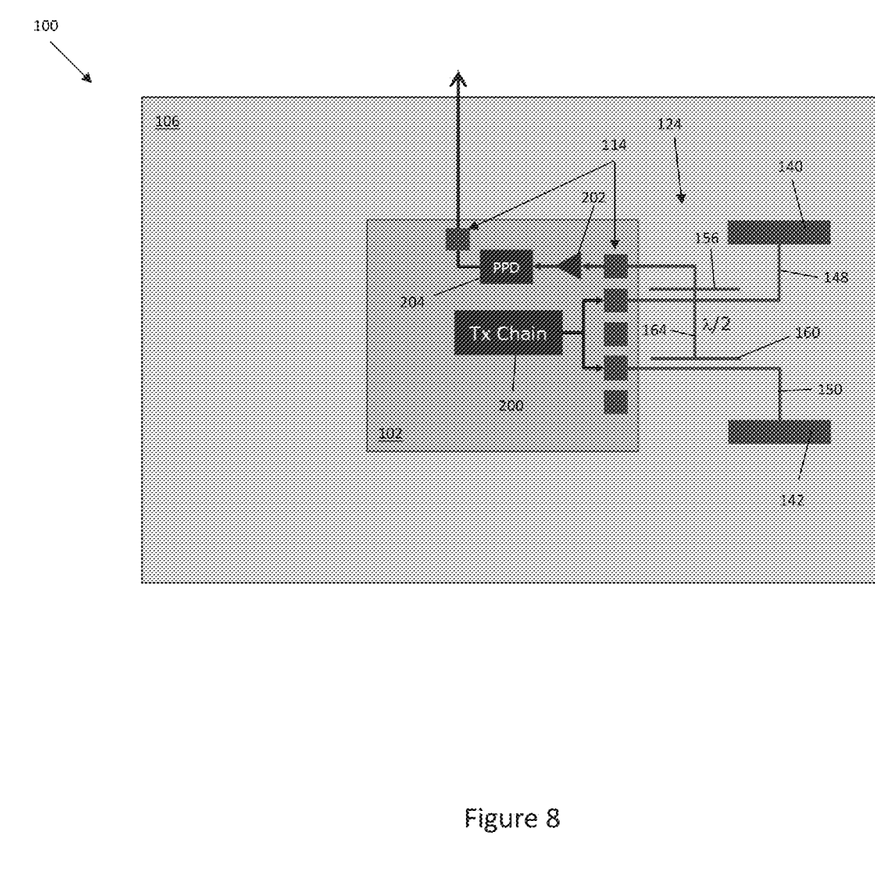
FIG. 8 illustrates a block diagram of yet another embodiment of a semiconductor package that includes an integrated transmit antenna and a coupling structure and corresponding circuitry for verifying the internal transmit antenna connections.

FIG. 8 illustrates a block diagram of yet another embodiment of a semiconductor package 100 that includes integrated antenna elements. The embodiment shown in FIG. 7 is similar to the embodiment shown in FIG. 6, however, the antenna 120 is implemented in a differential manner. In this case, two antennas 140, 142 are directly or indirectly connected to different pads 114 of the semiconductor die 102 by separate feedlines 148, 150. The coupling structure 124 comprises a first coupling element 156 such as a first directional coupler spaced in close proximity and parallel to one antenna 140 or feedline 148 connected to that antenna 140, a second coupling element 160 such as a second directional coupler spaced in close proximity and parallel to the other antenna 142 or feedline 150 connected to that antenna 142, and a $\lambda/2$ coupling element 164 directly or indirectly connecting the first and second coupling elements 156, 160 to a pad 114 of the semiconductor die 102 where $\lambda$ is the wavelength. The $\lambda/2$ coupling element 164 allows for single-ended termination at the semiconductor die 102, simplifying the design of the transmit path verification circuit included in the die 102. As such, only a single amplifier 202 and peak detector 204 is needed for indicating if the antennas 140, 142 are electrically connected to the corresponding pads 114 of the semiconductor die 102 based on the combined signal from the coupling structure 124 which in turn corresponds to the energy sensed by the two coupling elements 156, 160 of the coupling structure 124. The transmitter circuit 200 included in the semiconductor die 102 drives a differential signal onto the two transmit antennas 140, 142 during normal operation. In test mode, the single-ended signal from the $\lambda/2$ coupling element 164 is amplified by the amplifier 202 and input to the peak detector 204. The peak detector 204 outputs a voltage corresponding to the peak value of the amplified single-ended signal from the $\lambda/2$ coupling element 164, which can be driven off the die and out of the package 100 for analysis as previously described herein.

Figure 9:
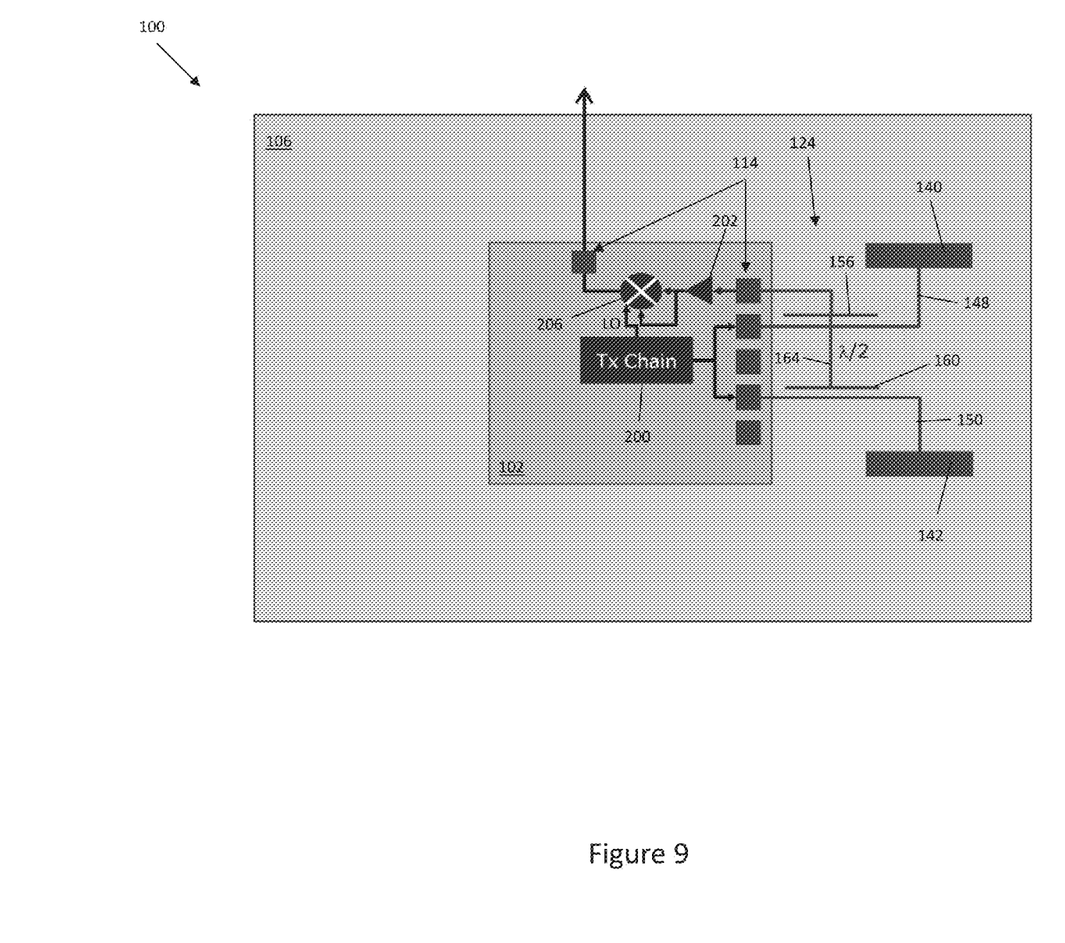
FIG. 9 illustrates a block diagram of still another embodiment of a semiconductor package that includes an integrated transmit antenna and a coupling structure and corresponding circuitry for verifying the internal transmit antenna connections.

FIG. 9 illustrates a block diagram of still another embodiment of a semiconductor package 100 that includes integrated antenna elements. The embodiment shown in FIG. 9 is similar to the embodiment shown in FIG. 8, however, the transmit path verification circuit comprises a mixer 206 instead of a peak detector 204. The mixer 206 is operable to mix the amplified signal from the coupling structure 124 with a local oscillator signal (LO) from the transmitter circuit. Since the amplified signal from the coupling structure and the local oscillator signal have the same frequency, the mixer output is at DC and the phase translates into an amplitude. Imperfections in the amplitude and phase balance of the baluns or mismatch in the diodes of the mixer 206 lead to an inherent DC offset voltage even when the signals are completely in phase. This is referred to as the DC offset voltage of the mixer 206, and is an indication of whether the antennas 140, 142 are electrically connected to the corresponding pads 114 of the semiconductor die 102.

Figure 10:
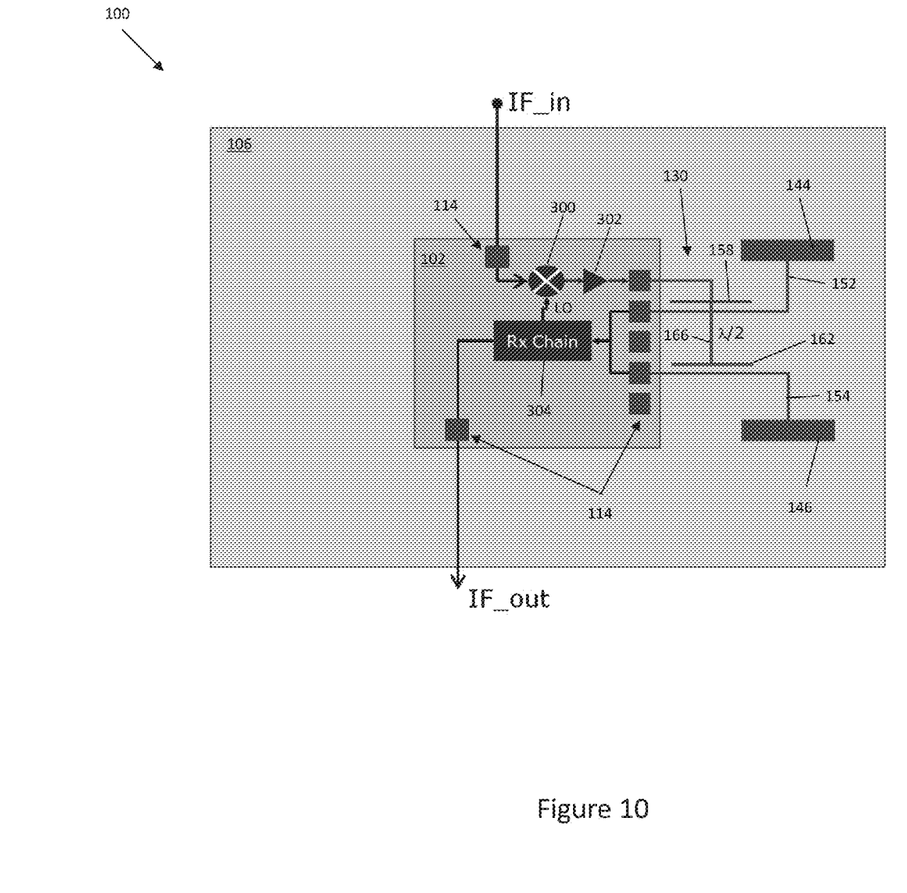
FIG. 10 illustrates a block diagram of an embodiment of a semiconductor package that includes an integrated receive antenna and a coupling structure and corresponding circuitry for verifying the internal receive antenna connections.

FIG. 10 illustrates a block diagram of still another embodiment of a semiconductor package 100 that includes integrated antenna elements. According to this embodiment, the package 100 includes a receive antenna embedded in insulating material 106. The receive antenna is implemented in a differential manner in that the receive-side has two antennas 144, 146 directly or indirectly connected to different pads 114 of the semiconductor die 102 by separate feedlines 152, 154. The receive-side coupling structure 130 comprises a first coupling element 158 such as a first directional coupler spaced in close proximity and parallel to one receive antenna 144 or feedline 152 connected to that receive antenna 144, a second coupling element 162 such as a second directional coupler spaced in close proximity and parallel to the other receive antenna 146 or the feedline 154 connected to that receive antenna 146, and a $\lambda/2$ coupling element 166 directly or indirectly connecting the first and second coupling elements 158, 162 to a pad 114 of the semiconductor die 102 where $\lambda$ is the wavelength. The $\lambda/2$ coupling element 166 allows for single-ended termination at the semiconductor die 102, simplifying the design of the receive path verification circuit included in the die 102. For example, only a single mixer 300 and amplifier 302 is needed for driving a test signal into the receive-side coupling structure 130 according to this embodiment.

The semiconductor die 102 includes a receiver circuit (Rx Chain) 304 for receiving signals from the feedlines 152, 154 connected to the respective receive antennas 144, 146 during normal operation. The receiver circuit 304 is used during testing to verify the internal receive antenna connections. More particularly, the receive path verification circuit drives a test signal onto the receive-side coupling structure 130 so that energy from the test signal couples to the receive antennas 144, 146 or the feedlines 152, 154 connected to the receive antenna 144, 146. The receiver circuit 304 detects a coupling signal that corresponds to the energy of the test signal coupled to the receive antennas 144, 146/feedlines 152, 154. The coupling signal detected by the receiver circuit 304 indicates if the antenna is electrically connected to the first pad of the semiconductor die.

In one embodiment, the receive path verification circuit comprises a mixer 300 for mixing an intermediate frequency test signal (IF_in) externally provided to the package 100 with a local oscillator signal (LO) generated by the receiver circuit 304 to form an RF test signal. The receive path verification circuit also comprises an amplifier 302 for amplifying the RF test signal which is then driven onto the receive-side coupling structure 130 via a pad 114 of the die 102. With a coupling range of e.g. −30 dB to −40 dB between the receive-side coupling structure 130 and the receive antennas 144, 146/feedlines 152, 154, a suitable amount of energy from the RF test signal couples to the receive antennas 144, 146/feedlines 152, 154 (depending on placement of the coupling structure 130). The receiver circuit 304 included in the semiconductor die 102 detects a coupling signal from the receive antenna feedlines 152, 154 that corresponds to the RF energy of the test signal coupled to the receive antennas 144, 146/feedlines 152, 154. The receiver circuit 304 outputs a signal (IF_out) which indicates if the receive antennas 144, 146 are electrically connected to the corresponding pads 114 of the semiconductor die 102 based on the coupling signal detected. If the internal receive antenna connections are defective, then no coupling signal is detected. The receiver circuit output signal IF_out can be driven off the semiconductor die 102 via an output pad 114 and out of the semiconductor package 100 for external analysis. A single-ended dipole or monopole receive antenna configuration can instead be employed e.g. as previously described herein in connection with FIGS. 2-4.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a semiconductor die;
   an antenna embedded in insulating material contacting a first main side of the semiconductor die and electrically connected to a first pad of the semiconductor die; and
   a coupling structure embedded in the insulating material, electrically connected to a second pad of the semiconductor die and spaced from the antenna,
   wherein the coupling structure is configured to sense energy radiated from the antenna or a feedline connected to the antenna,
   wherein the semiconductor die includes a transmitter circuit operable to drive a signal onto the antenna through the feedline,
   wherein the semiconductor die includes a transmit path verification circuit operable to indicate if the antenna is electrically connected to the first pad of the semiconductor die based on a signal from the coupling structure that corresponds to the energy sensed by the coupling structure.

2. The semiconductor package of claim 1, wherein the transmit path verification circuit comprises:
   an amplifier electrically connected to the second pad of the semiconductor die and operable to amplify the signal from the coupling structure; and
   a peak detector operable to output a voltage corresponding to a peak value of the amplified signal from the coupling structure.

3. The semiconductor package of claim 1, wherein the transmit path verification circuit comprises:
   an amplifier electrically connected to the second pad of the semiconductor die and operable to amplify the signal from the coupling structure; and
   a mixer operable to mix the amplified signal from the coupling structure with a local oscillator signal from the transmitter circuit,
   wherein the amplified signal from the coupling structure and the local oscillator signal have the same frequency,
   wherein a DC offset voltage of the mixer indicates if the antenna is electrically connected to the first pad of the semiconductor die.

4. The semiconductor package of claim 1, wherein the antenna is a monopole antenna and the coupling structure comprises a single coupling element spaced in close proximity to the monopole antenna or the feedline connected to the monopole antenna.

5. The semiconductor package of claim 1, further comprising:
   an additional antenna embedded in the insulating material and electrically connected to a third pad of the semiconductor die,
   wherein the coupling structure comprises a first coupling element spaced in close proximity to the antenna or the feedline connected to the antenna, a second coupling element spaced in close proximity to the additional antenna or a feedline connected to the additional antenna, and a $\lambda/2$ coupling element connecting the first and second coupling elements to the second pad of the semiconductor die,
   wherein the transmitter circuit is operable to drive a differential signal onto the antenna and the additional antenna,
   wherein the transmit path verification circuit is operable to indicate if the antenna is electrically connected to the first pad of the semiconductor die and if the additional antenna is electrically connected to the third pad of the semiconductor die, based on a signal from the $\lambda/2$ coupling element that corresponds to energy sensed by the first and second coupling elements.

6. The semiconductor package of claim 1, wherein:
the antenna is formed in a metal layer disposed in the insulating material;
the metal layer is electrically connected to the first and second pads of the semiconductor die through openings in the insulating material; and
the coupling structure is formed in the same metal layer as the antenna, or in a different metal layer of the semiconductor package.

7. The semiconductor package of claim 6, wherein the coupling structure is formed in the same metal layer as the antenna and spaced in close lateral proximity to the antenna or the feedline connected to the antenna.

8. The semiconductor package of claim 6, wherein the coupling structure is formed in a different metal layer of the semiconductor package than the antenna and spaced in close vertical proximity to the antenna or the feedline connected to the antenna.

9. The semiconductor package of claim 1, wherein:
the semiconductor die is embedded in a molding compound so that the first main side of the semiconductor die is uncovered by the molding compound, and the insulating material is on the same side of the molding compound as the side of the semiconductor die which is uncovered by the molding compound;
the antenna is formed in a metal layer disposed in the insulating material;
the metal layer is electrically connected to the first and second pads of the semiconductor die through openings in the insulating material; and
the coupling structure is formed in the same metal layer as the antenna, or in a different metal layer of the semiconductor package.

10. The semiconductor package of claim 9, wherein the coupling structure is formed in the same metal layer as the antenna and spaced in close lateral proximity to the antenna or the feedline connected to the antenna.

11. The semiconductor package of claim 9, wherein the coupling structure is formed in a different metal layer of the semiconductor package than the antenna and spaced in close vertical proximity to the antenna or the feedline connected to the antenna.

12. The semiconductor package of claim 1, wherein an output of the transmit path verification circuit is electrically connected to an output pad of the semiconductor die.

13. The semiconductor package of claim 1, wherein the coupling structure has between −30 dB and −40 dB of coupling between the antenna or the feedline connected to the antenna.

14. The semiconductor package of claim 1, further comprising:
an additional antenna embedded in the insulating material and electrically connected to a third pad of the semiconductor die; and
an additional coupling structure embedded in the insulating material, electrically connected to a fourth pad of the semiconductor die and spaced from the additional antenna, the additional coupling structure being configured to sense energy radiated from the additional antenna or a feedline connected to the additional antenna,
wherein the semiconductor die includes a receiver circuit operable to receive a signal from the antenna through the additional feedline,
wherein the semiconductor die includes a receive path verification circuit operable to drive a test signal onto the additional coupling structure so that energy from the test signal couples to the additional antenna or the feedline connected to the additional antenna and the receiver circuit detects a coupling signal that corresponds to the energy of the test signal coupled to the additional antenna or the feedline connected to the additional antenna,
wherein the coupling signal detected by the receiver circuit indicates if the additional antenna is electrically connected to the third pad of the semiconductor die.

15. The semiconductor package of claim 14, wherein:
wherein the receive path verification circuit comprises a mixer operable to mix an intermediate frequency test signal with a local oscillator signal generated by the receiver circuit to form an RF test signal, and an amplifier operable to amplify the RF test signal.

16. A method of verifying an internal antenna connection within a semiconductor package that includes a semiconductor die, an antenna embedded in insulating material contacting a first main side of the semiconductor die and electrically connected to a first pad of the semiconductor die and a coupling structure embedded in the insulating material, electrically connected to a second pad of the semiconductor die and spaced from the antenna, the method comprising:
driving a signal onto the antenna through a feedline;
sensing, by the coupling structure, energy radiated from the antenna or the feedline connected to the antenna as a result of transmitting the signal; and
indicating if the antenna is electrically connected to the first pad of the semiconductor die based on a signal from the coupling structure that corresponds to the energy sensed by the coupling structure.

17. The method of claim 16, wherein indicating if the antenna is electrically connected to the first pad of the semiconductor die based on the signal from the coupling structure comprises:
amplifying the signal from the coupling structure by an amplifier included in the semiconductor die and electrically connected to the second pad of the semiconductor die; and
inputting the amplified signal from the coupling structure to a peak detector included in the semiconductor die; and
outputting a voltage by the peak detector that corresponds to a peak value of the amplified signal from the coupling structure.

18. The method of claim 16, wherein indicating if the antenna is electrically connected to the first pad of the semiconductor die based on the signal from the coupling structure comprises:
amplifying the signal from the coupling structure by an amplifier included in the semiconductor die and electrically connected to the second pad of the semiconductor die;
inputting the amplified signal from the coupling structure to a mixer included in the semiconductor die; and
mixing the amplified signal from the coupling structure with a local oscillator signal from the transmitter circuit,
wherein the amplified signal from the coupling structure and the local oscillator signal have the same frequency,
wherein a DC offset voltage of the mixer indicates if the antenna is electrically connected to the first pad of the semiconductor die.

19. The method of claim 16, further comprising:
driving an output signal off the semiconductor die and out of the semiconductor package that indicates if the antenna is electrically connected to the first pad of the semiconductor die.

20. The method of claim 16, wherein the semiconductor package further includes an additional antenna embedded in the insulating material and electrically connected to a third pad of the semiconductor die, and an additional coupling structure embedded in the insulating material, electrically connected to a fourth pad of the semiconductor die and spaced from the additional antenna, the method further comprising:
- driving a test signal onto the additional coupling structure so that energy from the test signal couples to the additional antenna or a feedline connected to the additional antenna;
- detecting a coupling signal from the feedline connected to the additional antenna that corresponds to the energy of the test signal coupled to the additional antenna or the feedline connected to the additional antenna; and
- indicating if the additional antenna is electrically connected to the third pad of the semiconductor die based on the coupling signal detected.

21. A semiconductor package, comprising:
a semiconductor die;
an antenna embedded in insulating material contacting a first main side of the semiconductor die and electrically connected to a first pad of the semiconductor die; and
a coupling structure embedded in the insulating material, electrically connected to a second pad of the semiconductor die and spaced from the antenna, the coupling structure being configured to sense energy radiated from the antenna or a feedline connected to the antenna,
wherein the semiconductor die includes a receiver circuit operable to receive a signal from the feedline connected to the antenna,
wherein the semiconductor die includes a receive path verification circuit operable to drive a test signal onto the coupling structure so that energy from the test signal couples to the antenna or the feedline connected to the antenna and the receiver circuit detects a coupling signal that corresponds to the energy of the test signal coupled to the antenna or the feedline connected to the antenna,
wherein the coupling signal detected by the receiver circuit indicates if the antenna is electrically connected to the first pad of the semiconductor die.

* * * * *